United States Patent [19]

Allegret et al.

[11] Patent Number: 5,431,971

[45] Date of Patent: Jul. 11, 1995

[54] PLATE INCLUDING A COATING OF ALUMINIUM, WITHIN ALUMINIUM OXYDE AGGLOMERATES FOR AN ELECTRODE OF AN ELECTROLYTIC CONDENSER

[75] Inventors: Francis Allegret, Goncelin; Mohamed Benmalek, St Martin d'Hères; Emmanuel Gariel, Corenc, all of France

[73] Assignee: Satma, Goncelin, France

[21] Appl. No.: 17,491

[22] Filed: Feb. 12, 1993

[30] Foreign Application Priority Data

Feb. 14, 1992 [FR] France .................. 92 01899

[51] Int. Cl.⁶ .................. H01G 9/04; C23C 14/06; B32B 5/22
[52] U.S. Cl. .................. 428/148; 428/141; 428/143; 428/328; 428/215; 428/336; 428/338; 428/312.2; 428/704; 428/546; 428/550; 361/509; 361/529
[58] Field of Search .............. 428/141, 143, 148, 328, 428/215, 336, 338, 312.2, 704, 546, 550; 361/504, 524

[56] References Cited

U.S. PATENT DOCUMENTS

| | | | |
|---|---|---|---|
| 3,004,332 | 10/1961 | Werner | 361/529 |
| 3,665,260 | 5/1972 | Kirkpatrick et al. | 361/529 |
| 3,697,822 | 10/1972 | Alwitt et al. | 29/25.03 |
| 4,214,293 | 7/1980 | Sterling et al. | 361/529 |
| 4,309,810 | 1/1982 | Drake | 427/124 |
| 4,468,719 | 8/1984 | Shimizu et al. | 361/529 |
| 4,763,229 | 8/1988 | Ohtuka et al. | 361/433 |
| 4,861,439 | 8/1989 | Stevens et al. | 361/509 |
| 4,970,626 | 11/1990 | Kakinoki et al. | 361/509 |
| 5,055,319 | 10/1991 | Bunshah et al. | 427/38 |

FOREIGN PATENT DOCUMENTS

| | | | |
|---|---|---|---|
| 1281792 | 7/1972 | United Kingdom | 361/529 |
| 2056503 | 3/1981 | United Kingdom . | |

*Primary Examiner*—William P. Watkins, III
*Attorney, Agent, or Firm*—Dennison, Meserole, Pollack & Scheiner

[57] ABSTRACT

The invention relates to a plate which is intended to produce either an anode or a cathode of an electrolytic condenser. The plate is in the form of an electricity conducting substrate coated with an aluminium based deposit constituted of grain agglomerates where more than 50% by weight of the total deposited aluminium is in oxide state and forms a porous matrix of aluminium oxide containing metallic aluminium crystallites. The invention enables plates to be obtained which have an increased output, and the invention thus enables the condensers which will be associated with them to be of reduced size.

8 Claims, 3 Drawing Sheets

PLATE INCLUDING A COATING OF ALUMINIUM, WITHIN ALUMINIUM OXYDE AGGLOMERATES FOR AN ELECTRODE OF AN ELECTROLYTIC CONDENSER

BACKGROUND OF THE INVENTION

1. Field of the Invention

The invention relates to a plate for an electrode of an electrolytic condenser with an increased electrical output which can reach a value above 300,000 microfarads/dm$^2$, and the invention also relates to a process for the manufacture of said plate.

The person skilled in the manufacture of electrolytic condensers, in particular those constituted of aluminium plates, knows that in order to obtain an increased output it is necessary to increase the surface area of the electrodes. This results in the application of all types of engraving to said plate.

Most frequently, the engraving is obtained by chemical or electrochemical attack which makes the surface of the plate rough and/or porous.

More recently, another technique has been used which consists in physically depositing a metal film on the plate in order to produce said porosity. This allows for an improvement in the output, whilst avoiding recourse to attack baths which use chemical products which are toxic or corrosive to varying degrees, or which are harmful to the environment.

In this coating process, as in the process for engraving, the plate obtained then undergoes a treatment known as chemical or electrochemical formation and/or stabilisation which uses an electrolyte and which is intended to prevent degradation of the surface state by the action of external agents, and which thus aims to preserve the output of the condenser over the passage of time.

In the coating domain, it is possible to cite, for example, U.S. Pat. No. 4,309,810 which discloses an electrolytic condenser in the form of a metal or plastics substrate coated by evaporation under vacuum with a deposit of either aluminium or tantalum or an alloy of several metals. The deposit obtained is porous and formed of a series of metal crystal columns; however, when a trace of oxygen is introduced into the deposit chamber under vacuum the deposited crystals decrease in size, and crosslinkage to a certain extent of said crystals results.

To be more exact, this patent claims: "A process for obtaining a condenser, comprising three stages:
implementation of a substrate with a surface,
supply of a heat source with an anodisable metal coming from a thread spool,
evaporation of said metal to form a metallic vapour,
depositing said metallic vapour over the surface of said substrate at an angle of incidence of less than 60 degrees and in the presence of oxygen at a partial pressure not in excess of $10^{-4}$ Torr (0.0133 Pascal) in such a way as to obtain a porous metallic coating,
anodising the surface of the porous coating,
providing an electrical contact on said anodised surface,
and winding said substrate bearing said anodised porous coating in the form of the condenser."

In one example of application, it is stated that an aluminium plate of thickness 10 micrometers is coated with a porous film which is 6 micrometers in thickness by evaporation of aluminium in a chamber under vacuum. After anodisation of the porous film in a solution with 4% by weight boric acid, and at 200 V formation voltage, the output of the aluminium plate per unit of surface area is 96 microfarads per dm$^2$.

The constant problem in the domain of electrodes of electrolytic condensers, whether for the anode or cathode, is that of their electrical output per unit of surface area. In fact, the greater the specific output, the greater the possible reduction in size of the electrodes, even with total output.

In addition to reducing the cost, this makes it possible for the condensers to be reduced in size and for them to be used in applications where a reduction in bulk and weight is desirable.

Since the method of coating a substrate with aluminium and then following it by formation and/or stabilisation has made progress from the point of view of electrical output, the Inventor thought that by using this same method it would be possible to make considerable improvements and to reach output values far in excess of those reached hitherto, in particular by using much thinner coatings, thus at a much lower cost.

The Inventor found that this improvement necessitated the presence of a deposit of a special composition and structure which adheres properly to the substrate, this deposit also having to be suitably stable with the passage of time, in particular to external agents in such a way that the output is preserved with the passage of time.

SUMMARY OF THE INVENTION

The invention consists of a plate for an electrode of an electrolytic condenser, in the form of an electricity conducting substrate made rough, or otherwise, coated by vaporisation-condensation on one of its two faces with a deposit containing, in particular, aluminium, the thickness of said deposit being between 100 and 10000 nanometers, characterised in that said deposit contains more than 50% aluminium in the form of oxide and is constituted, of grain agglomerates, said agglomerates forming a porous matrix of aluminium oxide containing metallic aluminium crystallites arranged randomly inside the grains.

Thus, compared with U.S. Pat. No. 4,309,810 where the deposit is in the form of a series of metal crystal columns which are cross-linked to varying degrees, the present invention differs as follows respect to the product:

from the point of view of composition, the deposit is not in the form of pure aluminium, but of a mixture wherein more than 50% by weight of the aluminium is in the form of oxide;

from the point of view of structure, the deposit is constituted of grain agglomerates which form a porous matrix of oxide, and aluminium crystallites are dispersed in the grains unlike in the prior art where the deposit was constituted of an assembly of purely metallic crystals.

Also, the deposit obtained is of a colour which can go from light grey beige to pitch black.

These special features of the deposit give the plates coated therewith quite a high output.

Preferably, the agglomerates have a mean diameter of between 100 and 1000 nanometers; the grains of the agglomerates have a mean diameter of between 10 and 50 nanometers, whilst the crystallites which are embedded in said grains have a diameter of less than that of the grains and with a mean value of between 1 and 20 nanometers.

In fact, outside these brackets, the outputs obtained, whilst being suitable, are not as good, and deteriorate away from the limit values.

Preferably, the grains are arranged in such a way that they allow a crosslinked network of communicating cavities between them in such a way that the deposit forms a porous mass where the volume of the cavities is between 20 and 50% of the volume of the deposit.

This structure permits complete penetration of the electrolyte, which allows all the surface area produced during the formation operation and/or stabilisation operation and during final use in the condenser to be used. This gives a high output and provides great stability of performance with the passage of time.

Thus, in particular, the stabilisation treatment results in the presence, in the deposit as a whole, of compounds which inhibit oxidation or hydration by external agents, preferably ions derived from oxygenated compounds of phosphorus.

As far as the electricity conducting substrate is concerned, it preferably belongs to the group constituted of aluminium, one of its alloys or a plastics material coated with aluminium.

This conductor is in the form of a continuous strip, the width and thickness of which are dependent on the size of the condenser which is to be manufactured, and the deposit according to the invention is applied to one, or preferably both, of its faces.

The invention also consists of a process for the manufacture of the deposit whose composition and structure have been described hereinabove.

The process is characterised in that the deposit is formed by vaporisation of aluminium and then condensation and solidification in an atmosphere containing oxygen or oxygenated compounds on a fixed or movable substrate inside a chamber where a pressure of between 2.8 and 0.3 Pa prevails in the deposit zone, and at a speed which increases with thickness between 0.03 and 0.2 micrometers per second.

Thus, the process according to the invention consists in applying the deposit in an oxidising atmosphere which can be constituted of pure oxygen, a gaseous mixture containing oxygen or oxygenated compounds. The important factor for obtaining a deposit whose composition and structure are in accordance with the invention is the pressure prevailing in the deposit zone, that is to say near the substrate. This pressure must be between 2.8 and 0.3 Pa.

In fact, it has been noted that when the pressure is less than 0.3 Pa, the value of the specific output rapidly decreases due to the smaller amount of aluminium in oxidised form which causes the deposit to become more dense and also the size of the deposited grains to decrease. Likewise, when the pressure exceeds 2.8 Pa. the specific output also decreases, but this time this is due to too great an increase in grain size.

Another feature of the process is the formation of a deposit which is between 100 and 10,000 nanometers in thickness at a relatively slow speed over one of the faces, between 0.03 and 0.2 micrometers per second per face. In fact, it has also been noted that this speed affected the specific output since it influenced the degree to which the cavities of the grains were crosslinked. At slow speed, the oxide matrix developed quickly, and at high speed the density of the deposit increased whilst the volume of the cavities and surface produced of the deposit decreased.

The thickness of the deposit is dependent, at a given speed, on the duration of the evaporation stage, but that stage preferably lasts for less than 100 seconds since when it lasts for longer than that time, the deposit obtained is thick, fragile and has blocked cavities which reduce the output.

Certainly, the specific output increases with the thickness of the deposit. However, a limit is given of 10000 nanometers since beyond that value, in addition to risks caused by the deposit becoming fragile, the costs of producing the deposit are prohibitive.

As far as the oxidising atmosphere is concerned, it is able to be continually regenerated in the chamber under the combined action of pumping by means of a vacuum pump and of pressurised intake of the oxidising gas which combine in such a way as to create circulation of the gases at a flow rate of between 1 and 100 l/h in the case of a deposit on one face alone. In fact, below 1 l/h, the aluminium particles evaporated are insufficiently oxidised to produce the desired structure, whilst above 100 l/h, the pressure increases in the chamber, bringing about a reduction in the output of the deposit.

Preferably, the oxidising gas enters the chamber at a pressure of between 0.002 and 0.04 MPa since outside this range the deposit obtained does not have suitable properties.

Under these conditions, the output after a deposit has been applied to the two faces can reach 300,000 microfarads per $dm^2$.

As far as vaporisation of the aluminium is concerned, it can be carried out by heating solid aluminium using the Joule effect, induction, bombardment of electrons, or electric arc.

However, it is not sufficient to obtain a deposit which has a good initial output; it is also necessary to restrict the degradation of the output obtained with the passage of time, this degradation being caused in particular by hydration or oxidation due to contact with external agents, such as air humidity, for example.

For this reason it is necessary to subject the deposit which may have been formed beforehand to a chemical or electrochemical stabilisation treatment, which, despite causing a reduction to the initial output of the non-stabilised plate, enables that output to be maintained at its new value over the passage of time.

This stabilisation treatment is preferably carried out by immersing the coated substrate in an aqueous solution containing ions derived from oxygenated compounds of phosphorus and wherein an electric current can pass.

In the case of an electrochemical treatment, anodisation of the plate takes place at an electrical voltage which varies depending on the final application.

BRIEF DESCRIPTION OF THE DRAWINGS

The invention will be better understood with the aid of the accompanying drawings, wherein.

DESCRIPTION OF THE INVENTION

Figure 1:
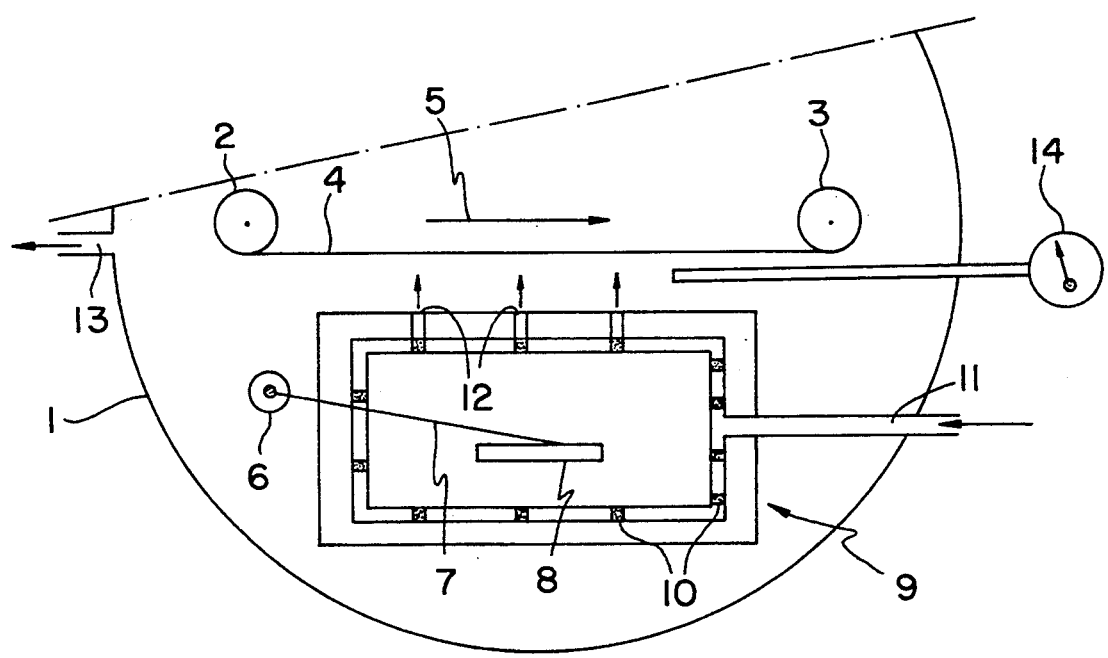
FIG. 1 shows a vertical section through a device for manufacture of the plate (deposit on one face).

In FIG. 1 it is possible to see a deposit chamber 1 inside which are placed a unwinding bobbin 2 and a winding up bobbin 3 which make it possible for a substrate 4 to be displaced in the direction of the arrow 5 above the thermal evaporation system for the aluminium comprising a supply means 6 for the aluminium thread 7 which is molten in the crucible 8 heated by a heat source, not shown, and placed inside a chamber 9 provided with openings 10 through which the oxidising gas arrives which is introduced under pressure through the conduit 11 and channels 12 through which the mixture of aluminium vapours and oxidising gas escapes towards the substrate; a tube 13 placed over the wall of the chamber and connected to a pumping system, not shown, allows a suitable pressure to be maintained in the deposit zone, this pressure being measured using a manometer 14, and for the gas to circulate at a flow rate measured over the conduit 11 by a flow meter, not shown.

In this arrangement, the deposit is applied to one face only. By fitting a second crucible and by modifying the system for displacement of the substrate it is possible to apply the deposit to both faces simultaneously.

Figure 2:
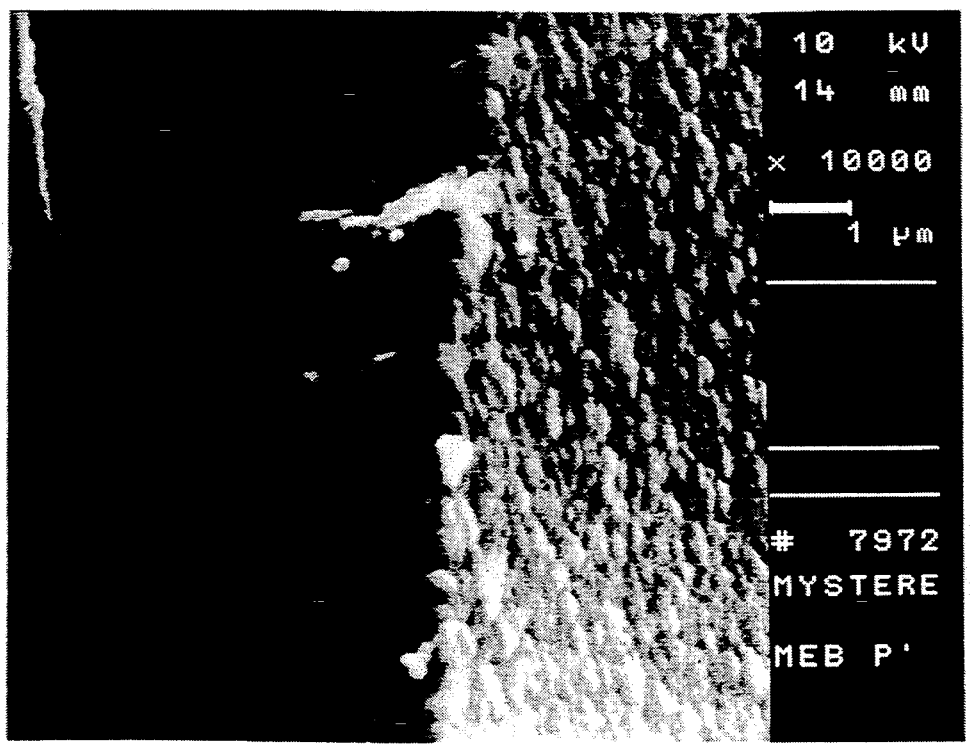
FIG. 2 is a micrograph, obtained using an electronic microscope, across the edge of a deposit.

In FIG. 2 it is possible to see the edge of a deposit which is 2200 nanometers in thickness, which is homogeneous and the growth morphology of which reveals agglomerates which are between 200 and 800 nanometers in size.

Figure 3:
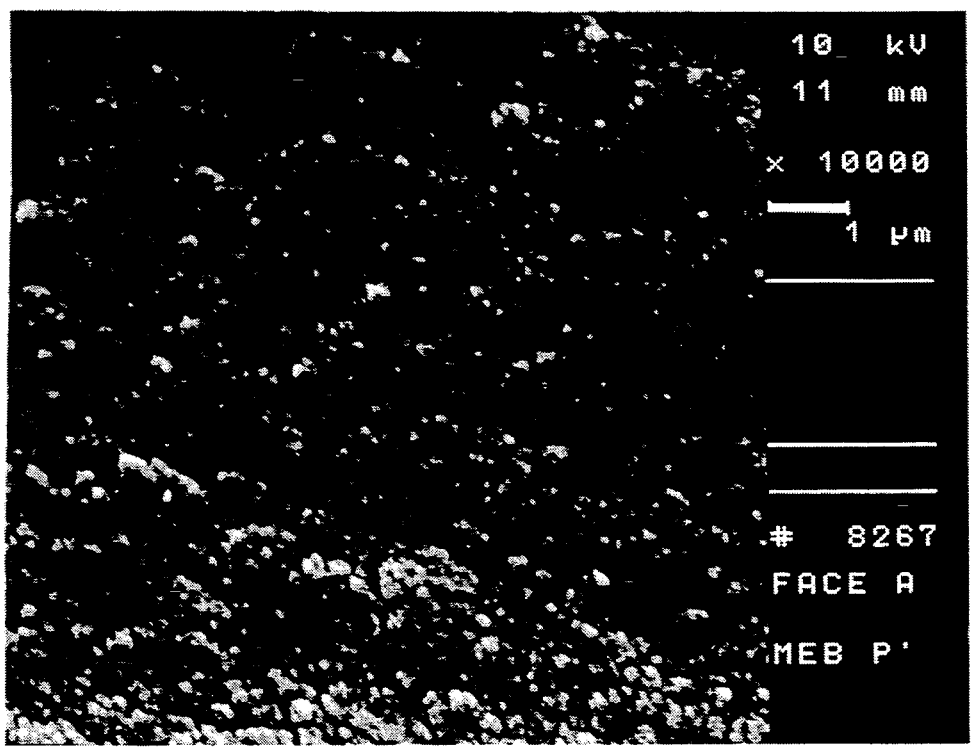
FIG. 3 is a micrograph, obtained using an electronic microscope, along the outer surface of a deposit.

In FIG. 3, which is to a scale of ×10000, it is possible to see a surface where the contour of the agglomerates has a mean diameter of 300 nanometers.

Figure 4:
FIG. 4 is a micrograph, obtained using an electronic high resolution transmission microscope, of the layer of a deposit.

In FIG. 4, showing a fragment of the deposit, it is possible to see aluminium crystallites which have a mean diameter of 3 nanometers and which are dispersed in the oxidised aluminium mass.

Figure 5:
FIG. 5 is a view, provided by an atomic strength microscope, of the outer surface of a deposit.

In FIG. 5, it is possible to see a surface with an image field of 1 micrometer 1 micrometer where grains appear which are between 10 and 20 nanometers in size.

EXAMPLES OF APPLICATION

The invention will be better understood in the light of the following examples:

EXAMPLE 1

An aluminium plate, 99.5% by weight, 30 micrometers in thickness, 300 mm in width, and degreased after rolling is treated in accordance with the invention under the following conditions:
intake pressure of oxygen: 0.005 MPa;
flow rate of gas: 15 l/h;
pressure in deposit zone: 1.2 Pa;
speed of deposit: 0.08 micrometers/sec.;
duration of deposit: 30 seconds;
thickness of deposit: 2.4 micrometers.

After having the deposit applied to both its faces, the plate undergoes an anodic electrochemical stabilisation treatment at a voltage of 1.7 volts in an aqueous solution containing a mixture of phosphoric acid and ammonium phosphate.

Observations made using a variety of microscopic techniques have shown that the mean size of the grains is 15 nanometers and that of the crystallites is 3 nanometers.

By controlling the porosity obtained by measuring the specific surface area, it has been shown that the volume of the cavities is 30% the total volume of the deposit.

The output of the plate after one month of ageing is 180,000 microfarads/square decimeter.

EXAMPLE 2

A complex plate formed by co-lamination of a polypropylene film, 20 micrometers in thickness, and of two aluminium films 99.5% by weight, degreased, 10 micrometers in thickness, is treated in accordance with the invention under the following conditions:
intake pressure of oxygen: 0.02 MPa;
flow rate of gas: 70 l/h;
pressure in deposit zone: 2 Pa;
speed of deposit: 0.15 micrometers/sec.;
duration of deposit: 10 seconds;
thickness of deposit: 1.5 micrometers.

After the deposit has been applied to both faces, and after the stabilisation treatment, identical to that in Example 1, has been carried out, the same mean values of the plate as before are taken, and the following is measured:
mean grain size of 27 nanometers;
mean aluminium crystallite size of 5 nanometers;
volume of cavities- 20% total volume of deposit.

The output of the plate after one month's ageing is 80,000 microfarads/square decimeter.

EXAMPLE 3

A plate which is identical to that in Example 1 is treated in accordance with the invention under the following conditions:
intake pressure of oxygen: 0.007 MPa;
flow rate of gas: 20 l/h;
pressure in the deposit zone: 0.5 Pa;
speed of deposit: 0.1 micrometers/sec.;
duration of deposit: 100 seconds;
thickness of deposit: 10 micrometers.

After the deposit is applied to both faces and the stabilisation treatment, identical to that in Example 1, is carried out, the same mean values of the plate are noted as before, and the following measurements is measured:
mean grain size of 12 nanometers;
mean aluminium crystallite size of 2 nanometers;
cavity volume 35% total volume of deposit.

The output of the plate after one month's ageing is 250,000 microfarads/square decimeter.

In these examples, both faces of the substrate have been coated in two successive passages in the deposit chamber because of its configuration.

The invention can be used in manufacturing condensers of a high specific output, and permits a reduction in size of the condensers and an improvement in their cost.

We claim:

1. A stablized plate for an electrode of an electrolytic condenser, in the form of an electricity conducting substrate coated by vaporisation-condensation on one or both faces with a deposit containing aluminium, the thickness of said deposit being between 100 and 10000 nanometers, wherein said deposit contains more than 50% by weight of the total deposited aluminium in the form of oxide and is constituted of grains agglomerates, said agglomerates forming a porous matrix of aluminium oxide containing metallic aluminium crystallites embedded randomly inside said grains.

2. A stablized according to claim 1, wherein the agglomerates have a mean diameter of between 100 and 1000 nanometers.

3. A stablized plate according to claim 1, wherein the grains have a mean diameter of between 10 and 50 nanometers.

4. A stablized plate according to claim 1, wherein the crystallites have a diameter which is less than that of the grains in which said crystallites are embedded, said diameter having a mean value of between 1 and 20 nanometers.

5. A stablized plate according to claim 1, wherein the grains form a cross-linked network of communicating cavities between them.

6. A stablized plate according to claim 5, wherein the volume of the cavities is between 20 and 50% of the volume of the deposit.

7. A stablized plate according to claim 1, wherein the deposit also contains ions derived from an oxygenated compound of phosphorus.

8. A stablized plate according to claim 1, wherein the electricity conducting substrate is selected from the group consisting of aluminium, aluminium alloys, and plastics material coated with aluminium.

* * * * *